(12) United States Patent
Marion

(10) Patent No.: US 8,093,728 B2
(45) Date of Patent: Jan. 10, 2012

(54) CONNECTION BY FITTING TOGETHER TWO SOLDERED INSERTS

(75) Inventor: Francois Marion, Saint Martin le Vinoux (FR)

(73) Assignee: Commissariat a l'Energie Atomique (FR)

( * ) Notice: Subject to any disclaimer, the term of this patent is extended or adjusted under 35 U.S.C. 154(b) by 145 days.

(21) Appl. No.: 12/558,149

(22) Filed: Sep. 11, 2009

(65) Prior Publication Data

US 2010/0072631 A1    Mar. 25, 2010

(30) Foreign Application Priority Data

Sep. 25, 2008 (FR) ..................................... 08 56465

(51) Int. Cl.
*H01L 23/48* (2006.01)
*H01L 23/52* (2006.01)
(52) U.S. Cl. ................. 257/779; 257/697; 257/E23.026
(58) Field of Classification Search .................. 257/697, 257/779, E23.026
See application file for complete search history.

(56) References Cited

U.S. PATENT DOCUMENTS

| | | | |
|---|---|---|---|
| 4,914,267 A * | 4/1990 | Derbyshire | 219/85.1 |
| 5,234,865 A * | 8/1993 | Goebel et al. | 228/123.1 |
| 5,711,680 A * | 1/1998 | Tsuneaki et al. | 439/83 |
| 6,007,349 A * | 12/1999 | Distefano et al. | 439/71 |
| 6,179,198 B1 | 1/2001 | Eifuki et al. | |
| 6,439,924 B1 * | 8/2002 | Kooiman | 439/578 |
| 6,818,839 B2 * | 11/2004 | Hosaka et al. | 174/262 |
| 7,557,452 B1 * | 7/2009 | Williams et al. | 257/778 |
| 2004/0197979 A1 | 10/2004 | Jeong et al. | |
| 2005/0104222 A1 | 5/2005 | Jeong et al. | |
| 2005/0151273 A1 | 7/2005 | Arnold et al. | |
| 2006/0113681 A1 * | 6/2006 | Jeong et al. | 257/780 |
| 2007/0148817 A1 | 6/2007 | Williams et al. | |
| 2009/0305523 A1 * | 12/2009 | Di Stefano | 439/66 |

FOREIGN PATENT DOCUMENTS

JP       01226160 A    9/1989
WO    W02006054005 A1    5/2006

OTHER PUBLICATIONS

French Search Report, dated Dec. 23, 2008 for French Priority Application No. FR0856465 filed on Sep. 25, 2008.
Wong et al., "Characterization of a No-Flow Underfill Encapsulant During the Solder Reflow Process", 1998 Electronic Components and Technology Conference, pp. 1253-1259.
Wassink, "Soldering in Electronics 2nd Edition", Electrochemical Pub Limited, pp. 37-61.
P.C. Andricacos et al., "Damascene Copper Electroplating for Chip Interconnections", IBM Journal of Research and Development, vol. 42, Issue 5, Sep. 1998, pp. 567-574: ISSN:0018-8646.

* cited by examiner

*Primary Examiner* — Nitin Parekh
(74) *Attorney, Agent, or Firm* — Victor A. Cardona; Heslin Rothenberg Farley & Mesiti P.C.

(57) ABSTRACT

A connection device between two components includes a hollow conductive insert, into which is fitted another conductive insert, the electrical connection between the two inserts being provided by means of a solder element.

4 Claims, 4 Drawing Sheets

CONNECTION BY FITTING TOGETHER TWO SOLDERED INSERTS

CROSS REFERENCE TO RELATED APPLICATIONS

This application claims priority from French patent application No. 0856465, filed on Sep. 25, 2008, the entire disclosure of which is incorporated herein by reference.

FIELD OF THE INVENTION

The technical field to which the invention relates is that of microelectronics, and to be more specific that of the manufacture and vertical (better known as "flip-chip") connection of two components.

The present invention can be used in all sorts of devices requiring "flip-chip" interconnects, particularly with a very fine pitch, as is the case for the manufacture of very large scale very fine-pitch imaging devices.

It is proposed to establish the connection by fitting an insert into a hollow insert, and then making a solder between the two inserts.

PRIOR ART

There are currently basically two possibilities for joining together two components that require a large number of very fine-pitch vertical electrical connections using the "flip-chip" technique by thermocompression:
- the first thermocompression technique comprises pressing two beads, at temperature, one against the other so as to bind them by plastic deformation (FIG. 1A);
- the second technique, developed for the finest interconnect pitches, allows working at a lower temperature than the temperatures used in the first technique: it involves replacing one of the thermocompressed beads by a "hard" protuberance which penetrates into the solder bead opposite and breaks its native oxide surface to obtain an electrical contact, said method operating at low temperature. This second technique thus makes it possible to:
  reduce the assembly temperature and assembly pressure;
  control the crushing: there is no hard to control bead-on-bead plastic deformation.

This second technique, shown in FIG. 1B, is shown in the document WO2006/054005 and appropriate inserts are described in the document U.S. Pat. No. 6,179,198.

The present invention falls within this second technique, known as insertion thermocompression, and aims to resolve the limitations in relation thereto, which are basically two in number.

The first problem relates to the thermocompression forces. Indeed, the cross-section of the insert in the plane (X, Y) is required to be as low as possible so as to restrict the insertion force.

If the number of columns to be inserted increases, the insertion force to be exerted on the part for assembly is proportionate to the number N of connections to be implemented, and to the surface of their cross-section S, in accordance with the following formula:

$$F_{hyb} = k*S*N$$

This technique is thereby limited in respect of components with a very large number of connections, since it is known for example that a force of 4 tonnes would be needed to hybridize a matrix of 4 million pixels (1 g/bump).

The problem in relation to these forces may be exacerbated owing to the sensitivity of the assembled components. Some materials for assembly are thus very sensitive to local stresses, leading to the creation of destructive dislocations during thermocompression hybridization.

Alternatively, the forces brought into play are no longer compatible with the required precision of assembly. Indeed, the requisite maximum lateral movement after hybridization must be less than 1 micrometre.

The second major technical problem raised by the insertion thermocompression technique is related to the way the inserts are made.

Indeed, making protuberances in a semiconductor foundry may become problematic in respect of very fine pitches. If the cross-section of the inserts is reduced, conventional production techniques may prove hard to implement, given the fineness of the required inserts. This restriction is therefore related to the concept of a minimum fineness of photolithography. It is thus not possible to reduce the cross-section of a conventional full insert, for a given technological photolithographic resolution D, below the value $\pi*D^2/4$.

DISCLOSURE OF THE INVENTION

Having analysed all these specific constraints, a particular technical solution is proposed based on the following elements:
  a solder element providing a perfect tube-to-tube or tube-to-cylinder joint;
  the use of the special capillarity properties of solders.

Thus and in accordance with a first aspect, the present invention relates to a connection device between two components consisting of a hollow conductive insert, into which is fitted another conductive insert, the electrical connection between the two inserts being provided by means of a solder element.

The first conductive insert is therefore found on the surface of the first component for connection. This is a hollow, female, element, capable of receiving another conductive insert, itself located on the surface of the second component for connection.

This first conductive element, comparable to a tube, may either be of annular cross-section (in particular round or oval) or parallelepiped (particularly square or rectangular).

The second conductive insert (male part) is therefore of strictly smaller dimensions than the first (female part), so that it can be appropriately fitted therein. It may be full (comparable to a column or full cylinder) or hollow (comparable to a tube). To advantage, it is a hollow insert.

These two inserts are to advantage metal-based so that they can function as an electrical conductor. This may for example involve Cu, W, Pd, Ti, WSi, WN.

It is noteworthy in accordance with the invention that the connection device further comprises an electrically conductive solder material, in contact simultaneously with the two inserts and thereby connecting them both mechanically and electrically. This element in particular gives a perfect electrical joint between the two soldered inserts.

To make said joint, the internal and external surfaces of the facing inserts, respectively, are filled with a solder material.

In practice, the solder material may be deposited on the internal walls of the hollow insert at the time it is manufactured. Alternatively, the hollow insert is provided with a reservoir of solder at its bottom.

Given the capillarity properties of molten solders and where the fitted insert is hollow, the level of the solder between the two inserts may to advantage be higher than the level of the solder in this hollow insert.

Indeed and as is well known to the man skilled in the art (K. Wassink, Soldering in electronics, $2^{nd}$ ed Electrochemical Pub Limited, pp 37-61, Wetting of surfaces), a liquid placed in a tube of diameter D will rise by a height K/D in the column. Under the same principle, a solder placed between two parallel walls, separated by a distance L, will rise by a height K'/L between the walls. K and K' are a function of the surface properties at work (roughness, surface properties, possibility of creating intermetallics when soldering: same reference pp. 149-170).

By playing on all these properties (surface tension, surface wettability), and more particularly by designing a device wherein L<<D, things can easily be arranged so that the volume of solder provided in the bottom of the female tube rises essentially between the reduced space between the two tubes. In this way, said space is filled up, in the manner for example of conventional copper-to-copper solders used macroscopically in plumbing (oxyacetylene soldering of pre-inserted pipes with solder input).

In practice and as already stated, the distance L separating the lateral walls of the two inserts is to advantage not zero, to ensure that fitting is accurate on the one hand and to allow the solder material to rise between the two inserts on the other.

Furthermore and to advantage when hollow inserts are present, the length or diameter D of the fitted insert is much greater than the distance L separating the walls of the two inserts. This implies, as an additional advantageous condition, that the inserts have parallel walls. The solder element thus rises essentially in the space provided between the walls of the two inserts.

Another aspect of the invention relates to the connection method strictly speaking between the two components.

Said method has one significant advantage: the two inserts for connection can be interfaced with zero force.

In practice, said method can be broken down into two steps:

A standard "pick and place" positioning machine pre-inserts the components, before soldering. The parts inserted may then be moved with no risk of misalignment, prior to reflow soldering.

The soldering step, and strictly speaking the reflow soldering step, is then implemented. It may be implemented using a reflow oven.

At the end of this method, a connection element between components is obtained in accordance with the one described above.

In a particular embodiment, a layer of adhesive is deposited before fitting on the surface of at least one of the components, between the inserts. In the event of the sacrificial layer of the component provided with female inserts being retained, connection stability can also be improved.

BRIEF DESCRIPTION OF THE FIGURES

The way in which the invention can be implemented and the resulting advantages will become clearer from the following embodiment, given for information purposes and not restrictively, supported by the appended figures wherein.

EMBODIMENTS OF THE INVENTION

To obtain a connection element as per the object of the invention, and to implement the method for hybridizing between two components in accordance with the invention, protuberances (also known as inserts) intended for the connection need to be manufactured. These are located on the surface of the components which need to be connected electrically.

Figure 4:
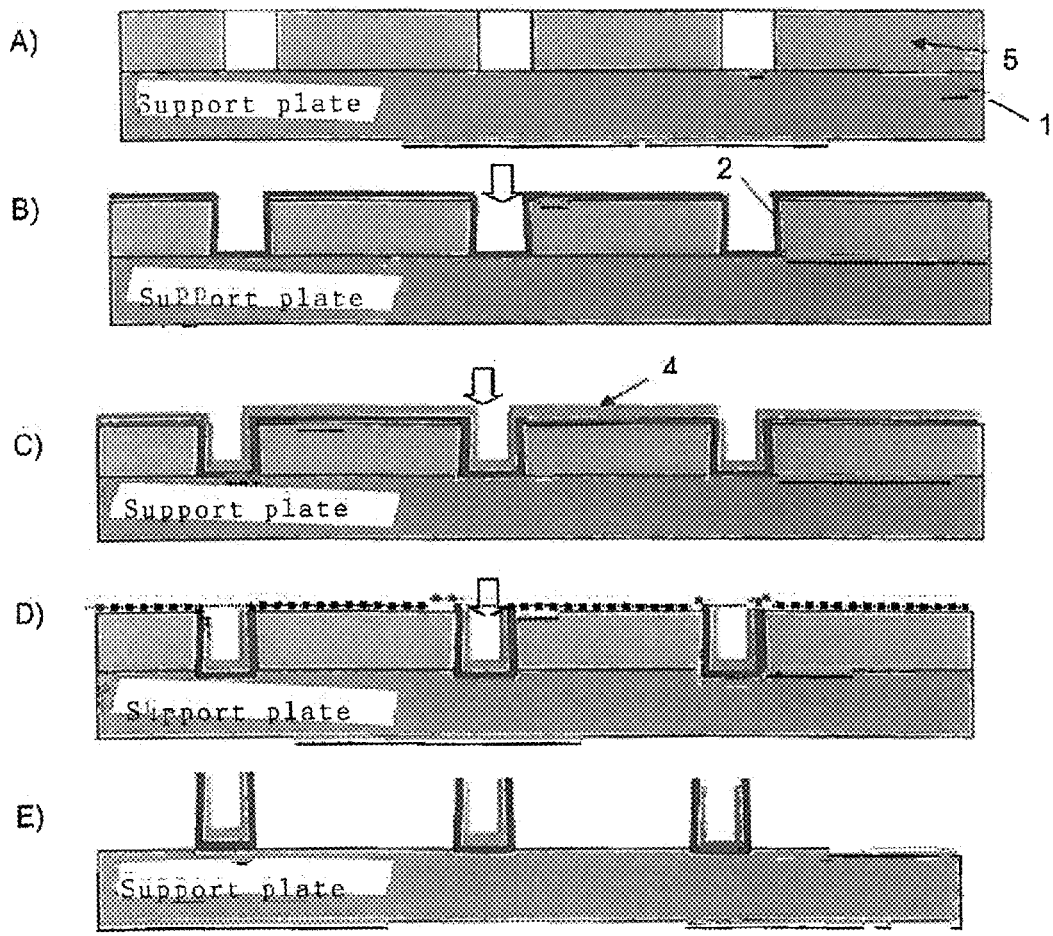
FIG. 4 is a diagram of the different steps in the manufacture of a component provided with "female" inserts according to the invention.

A component provided with inserts, in accordance with the present invention, may be obtained using the method shown in FIG. 4. This typically involves a CMOS ("metal-oxide semiconductor") wafer produced by a silicon foundry, a ceramic casing or the like.

FIG. 4 shows in more detail the manufacture of inserts or protuberances in the form of a female tube, with the internal walls thereof being metal-based and coated with a solder material.

The first step (FIG. 4A) comprises depositing, on the component for connection (1), a so-called "sacrificial" layer, of thickness e1 made using a resin (5). This layer is then subjected to standard photolithography. This step is used to create apertures of the required diameter for the tubes which will act as inserts (2). More generally, it is at this step that the future shape of the insert is set (height, aperture shape, etc.).

The second step (FIG. 4B) corresponds to the deposition of metal, possibly a metal multi-layer, matching the tube. It is the thickness of this deposition which will dictate the thickness e of the hollow insert. The metal is for example selected from the group that comprises: Cu, W, Pd, Ti, WSi, WN.

The aperture diameters can be controlled at values below 1 micrometre and heights above 3 micrometres.

The thicknesses of the metals can be adjusted and controlled down to values below 0.1 micrometre.

It is possible to modify, or simply to complete the usual metal deposition with an additional layer of a wettable metal, to advantage gold, platinum or copper. The advantage of this is that it facilitates subsequent soldering and the creation of the requisite intermetallic interfaces during the final soldering.

In a preferred embodiment, the hollow insert assumes a final "tube" shape, corresponding to a circular aperture. However, any other shape may be employed by an adapted design of the aperture mask: triangle, square, polygon, etc.

It is also possible to combine different shapes on a single manufactured plate and/or on a single chip to be hybridized.

The third step (FIG. 4C) comprises depositing a solder material (4) inside the tube, on its internal walls. This solder material is selected from conventionally used materials, that afford reliability of assembly: they do not cause the formation of "voids" and are resistant to electromigration, have good durability, do not present any premature ageing and are resistant to thermal cycling. This typically means (In), $In_xSn_y$, $Au_xSn_y$, or $Cu_xAg_ySn_z$. In practice, the solder material is deposited following the metal deposition implemented at the previous step (FIG. 4B).

The fourth step (FIG. 4D) comprises removing the metal layer, and the solder layer, found on the upper plane of the martyr resin. Two etching techniques, well known to the man skilled in the art, may be implemented: the "damascene etching" technique or "gap fill" method.

The last step (FIG. 4E), which is an optional step, corresponds to the removal of the martyr layer (5). This is a fully understood step known as de-lacquering.

Figure 2:
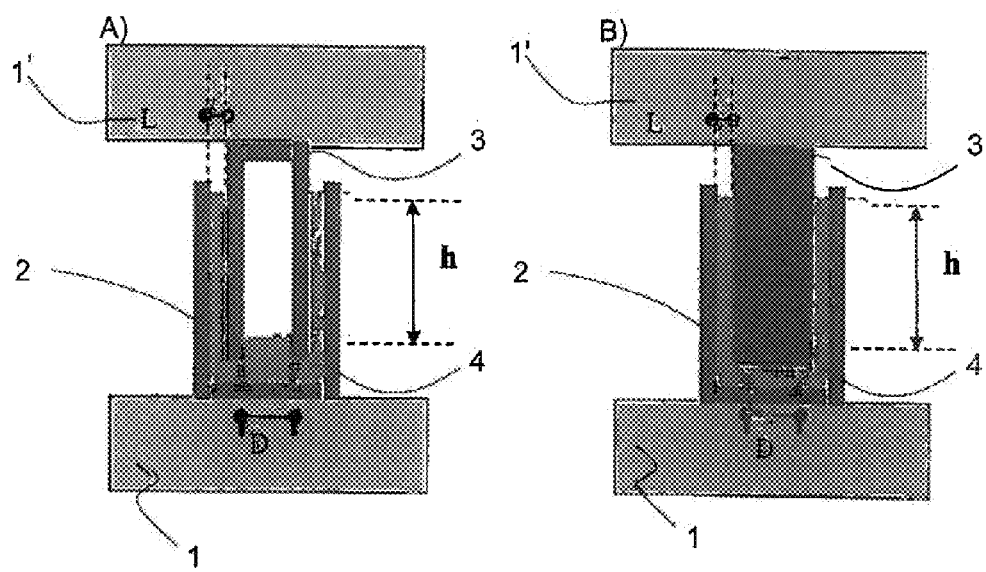
FIG. 2 is a diagram of an inventive connection device comprising a hollow insert into which is fitted a second insert, itself hollow (A) or full (B), the two inserts being in contact via a solder element.

A hollow female insert of this kind is for example shown in FIG. 2.

It is clear to the man skilled in the art that the male insert, intended to be fitted into the female insert described above, may be obtained using a similar method, give or take a few modifications:

the male insert has a cross-section of smaller dimension than that of the hollow female insert into which it is intended to be inserted or fitted;

the male insert is devoid of solder material, at least on its internal walls;

the male insert may assume the shape of a cylinder or a full parallelepiped. To achieve this, at the metal deposition step (FIG. 4B), the cavities generated in the martyr layer by photolithography (FIG. 4A) must be entirely filled with metal, leaving no voids. Furthermore, the man skilled in the art may easily produce cylinders, using electrolytic growth techniques widely described in the literature (see for example P. C. Andricacos et al., IBM Journal of Research and Development, 1998, 42(5), pp 567-74, *Damascene copper electroplating for chip interconnections*). Such a cylindrical shape for the male insert is shown in diagrammatic form in FIG. 5.

The components provided with such inserts may then be connected during the hybridization method set out in detail hereinafter.

Figure 3:
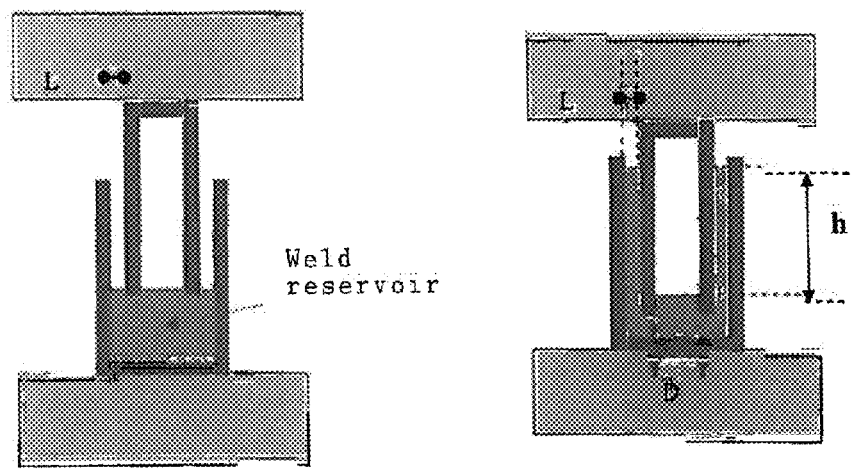
FIG. 3 is a diagram of the hybridization of two components via the insertion of a tube into another tube containing a solder material.

A first method is shown in diagrammatic form in FIG. 3 in relation to two hollow inserts, the female insert having a reservoir of solder.

Figure 6:
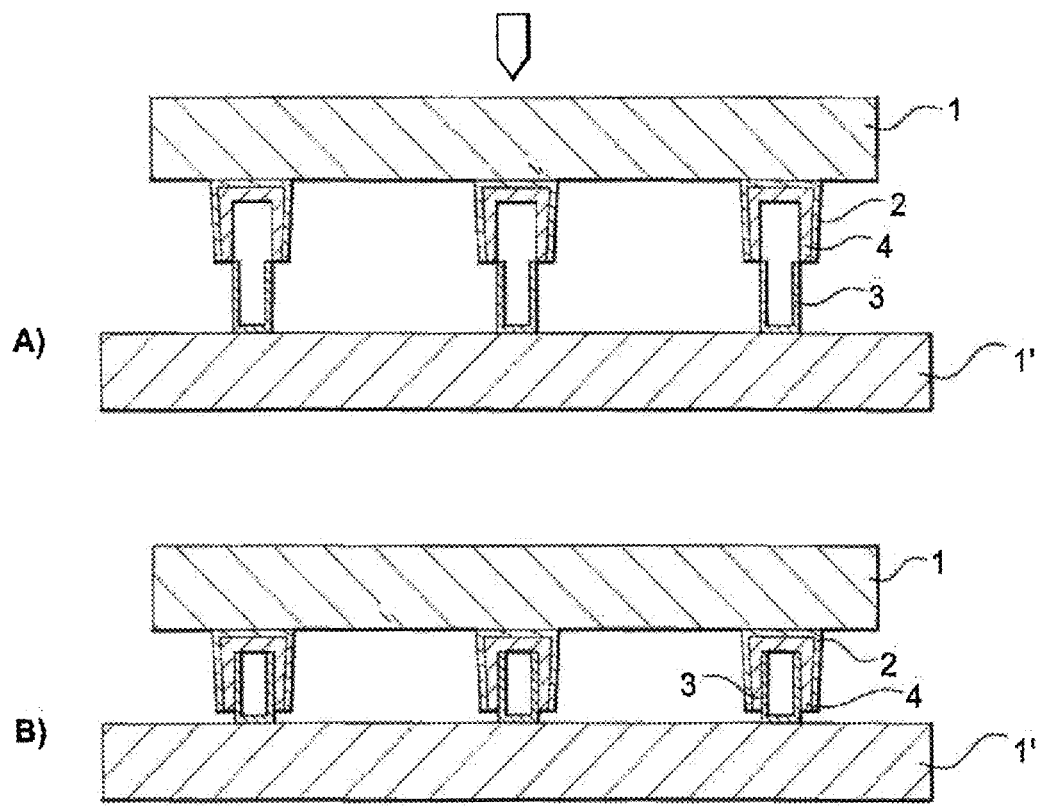
FIG. 6 shows in detail the inventive method for hybridizing between two components.

FIG. 6 shows in greater detail an inventive hybridization method:

In a first step (FIG. 6A), the female inserts, whereof the internal walls are coated with the solder material, are placed opposite the male inserts. The weight of the upper chip is then sufficient to fit together the facing inserts. If need be, a slight pressure is exerted to complete the fitting.

After insertion with almost zero force, two components are obtained that are electrically connected by means of an inventive connection device (FIG. 6B).

Figure 7:
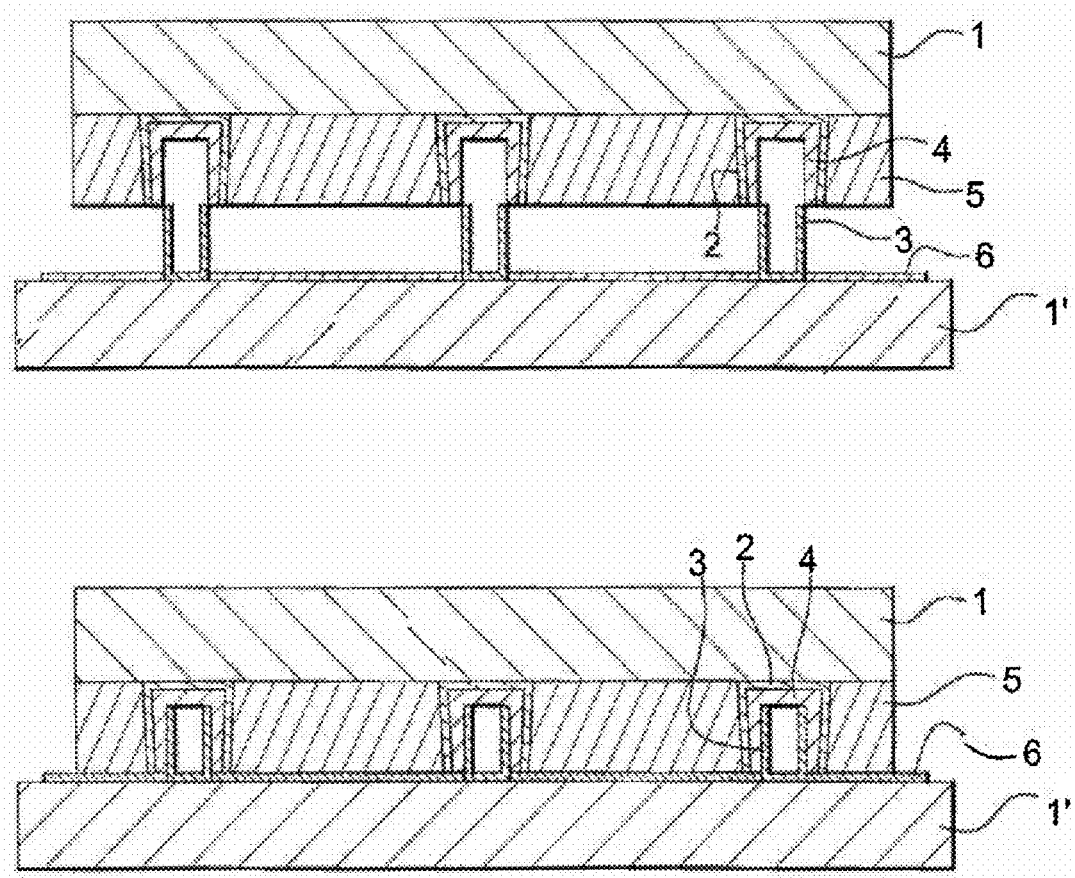
FIG. 7 shows in detail an alternative inventive hybridization method, involving the retention of a "sacrificial" layer and strengthening by bonding.
Figure 1:
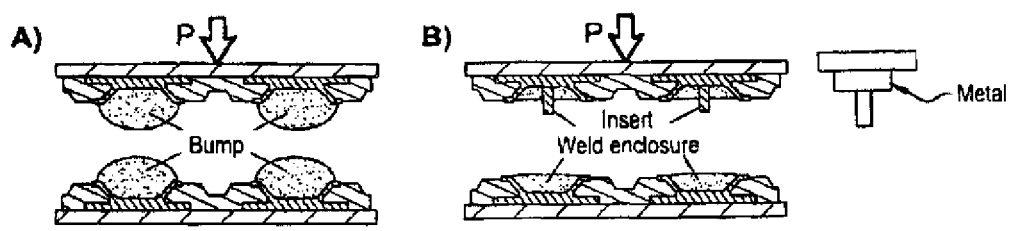
Figure 2:
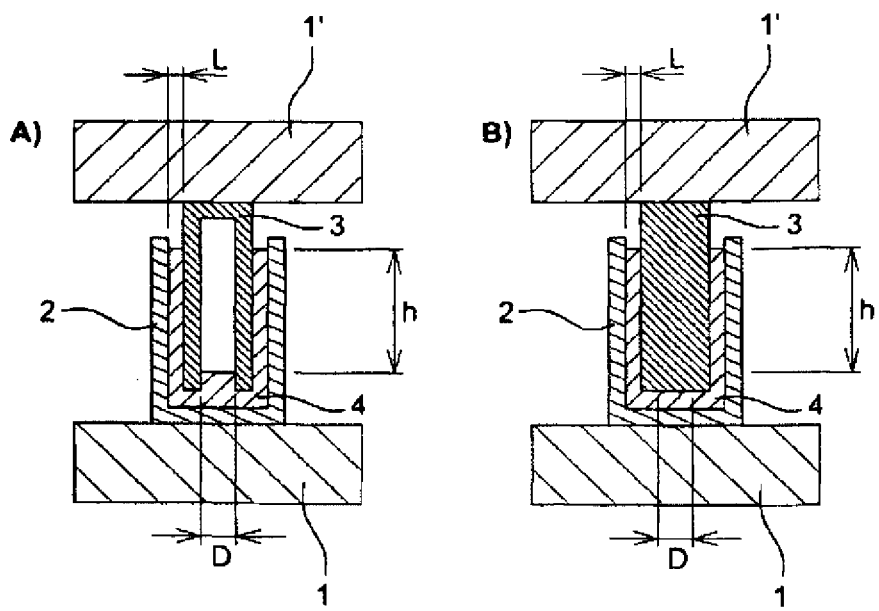
Figure 3:
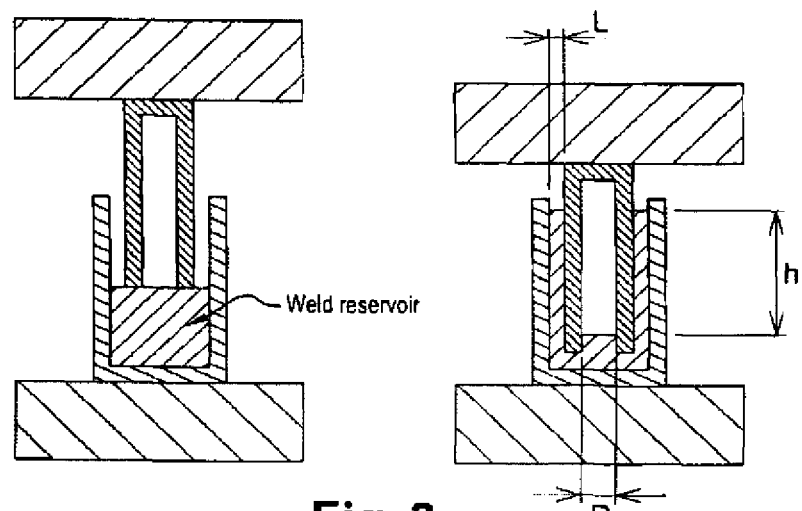
Figure 4:
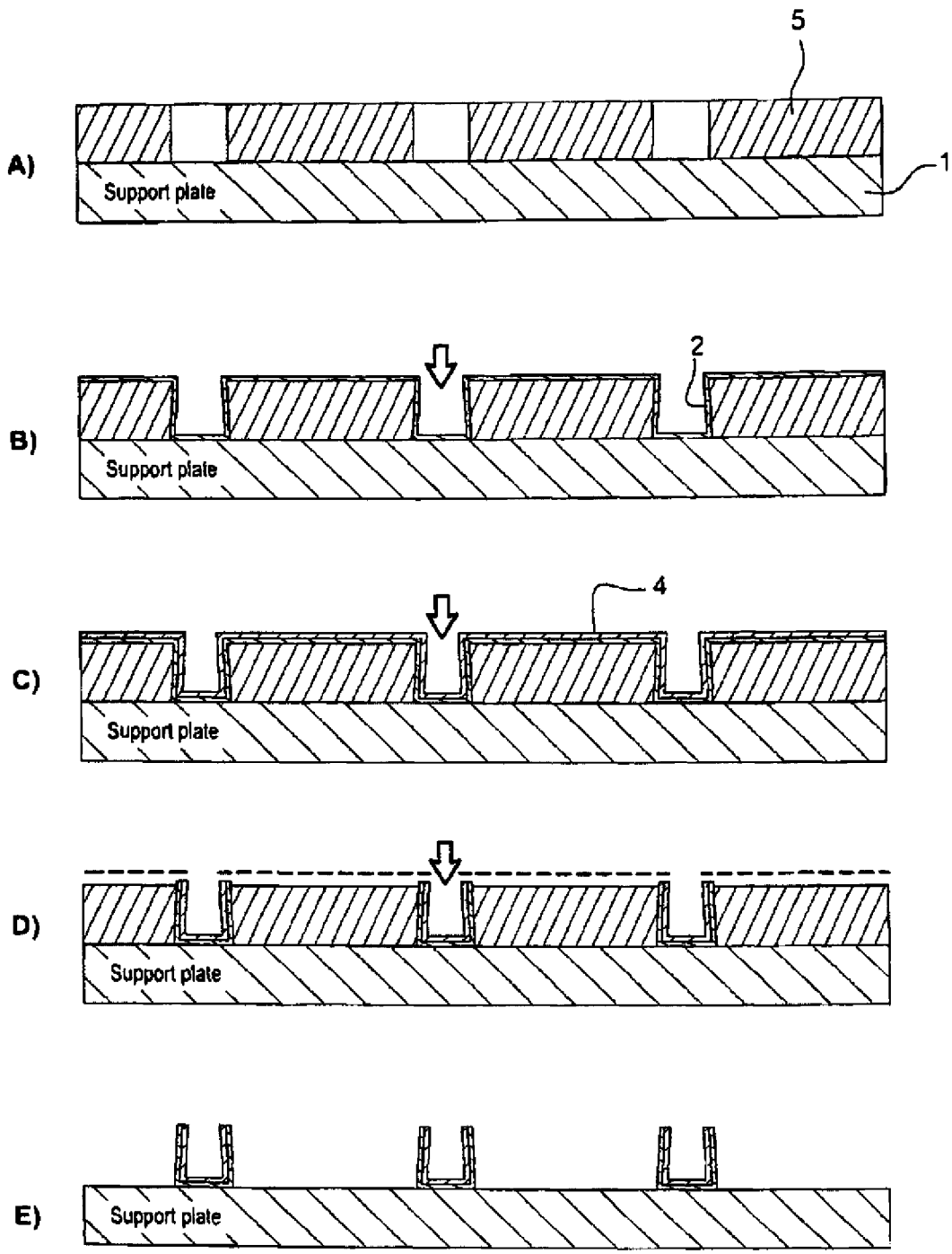
Figure 5:
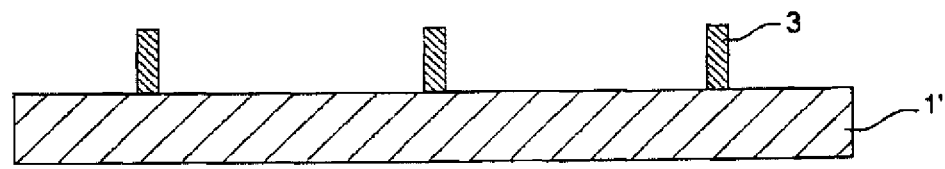
Figure 6:
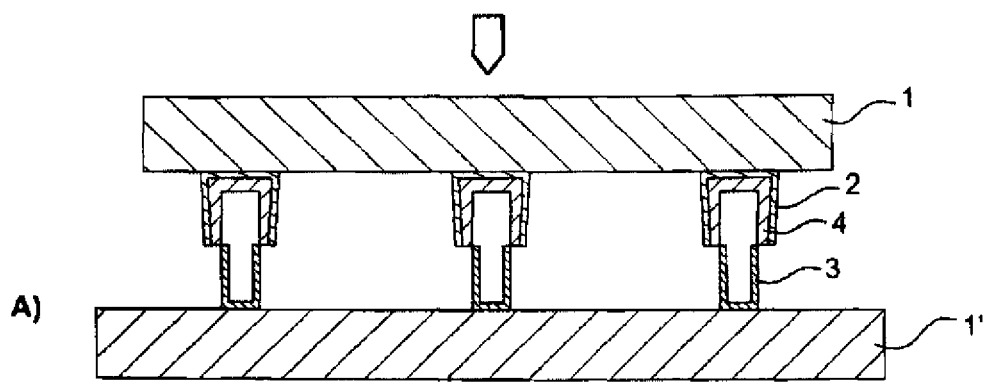
Figure 6:
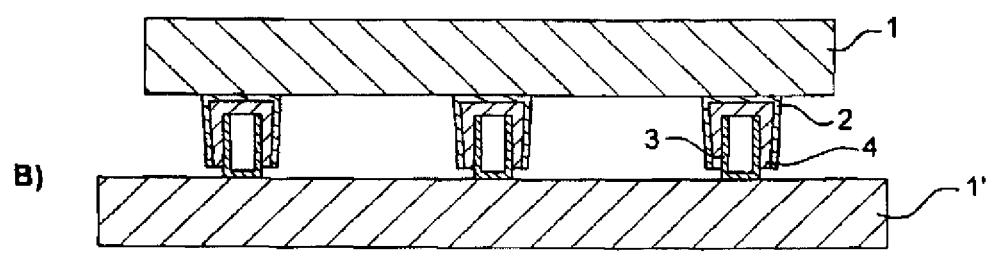
Figure 7:
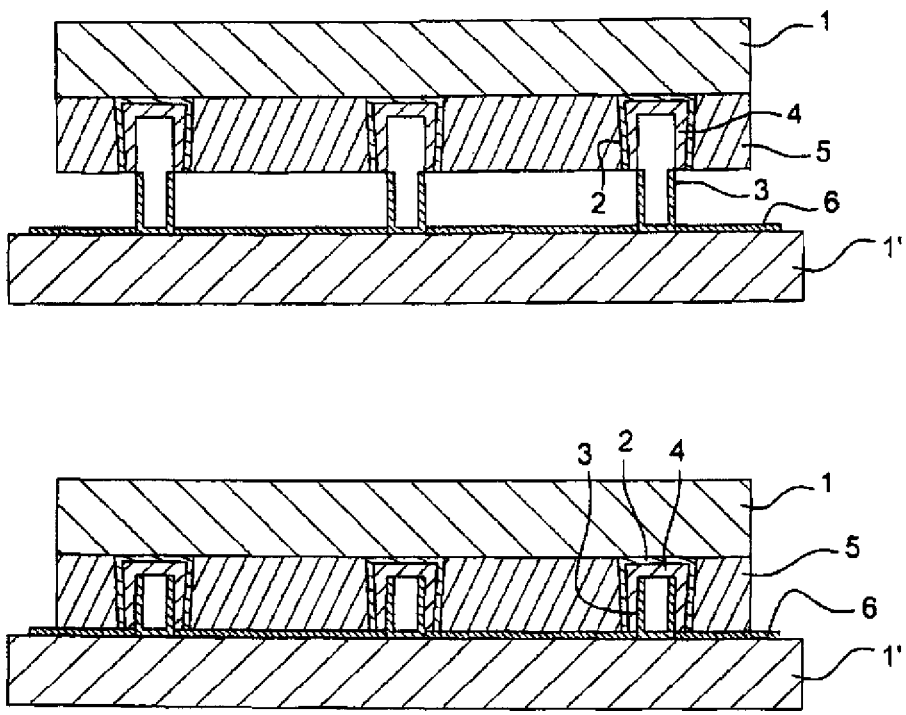
Figure 1:
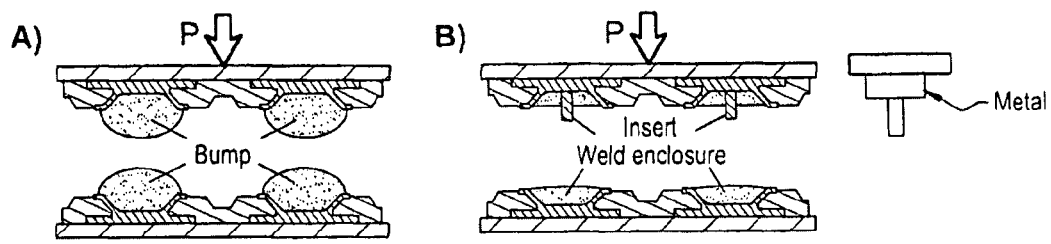
Figure 2:
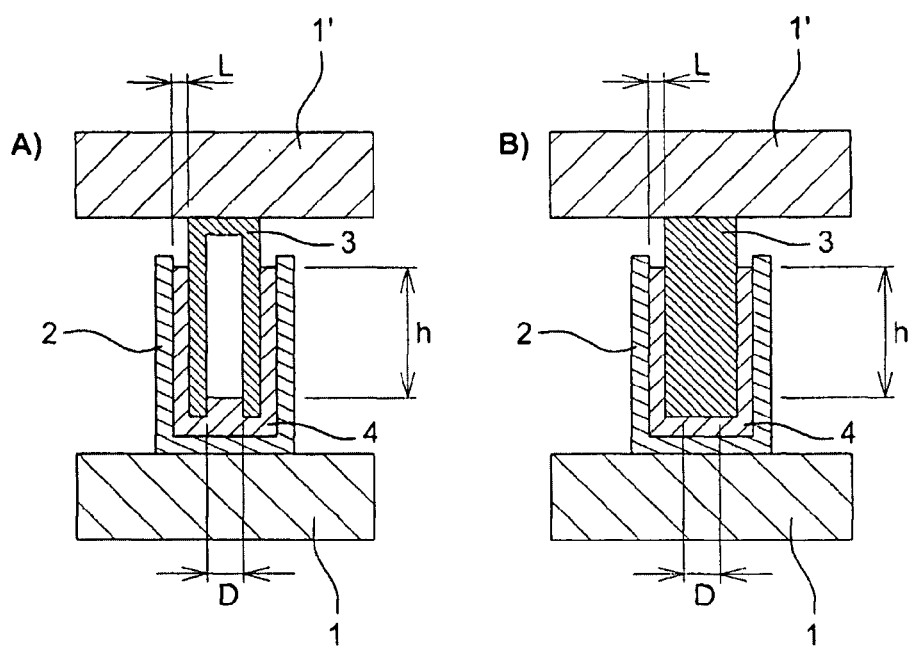
Figure 3:
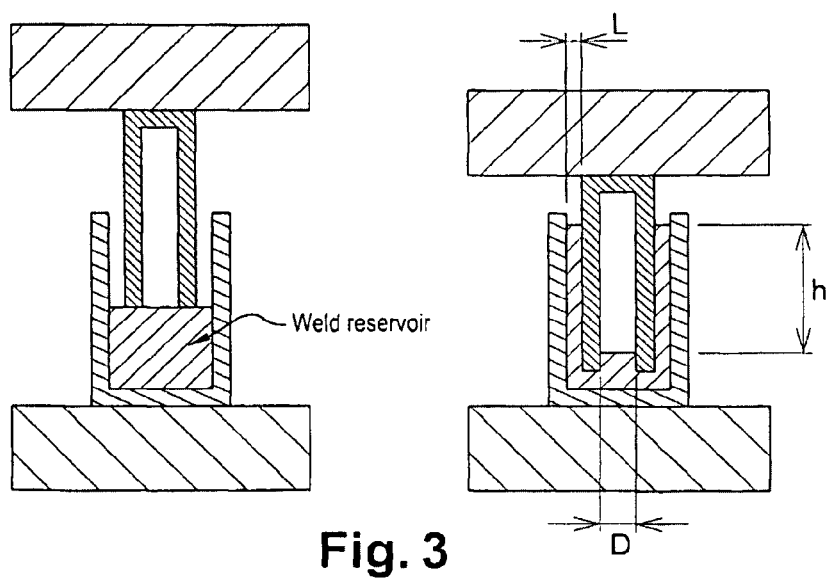
Figure 4:
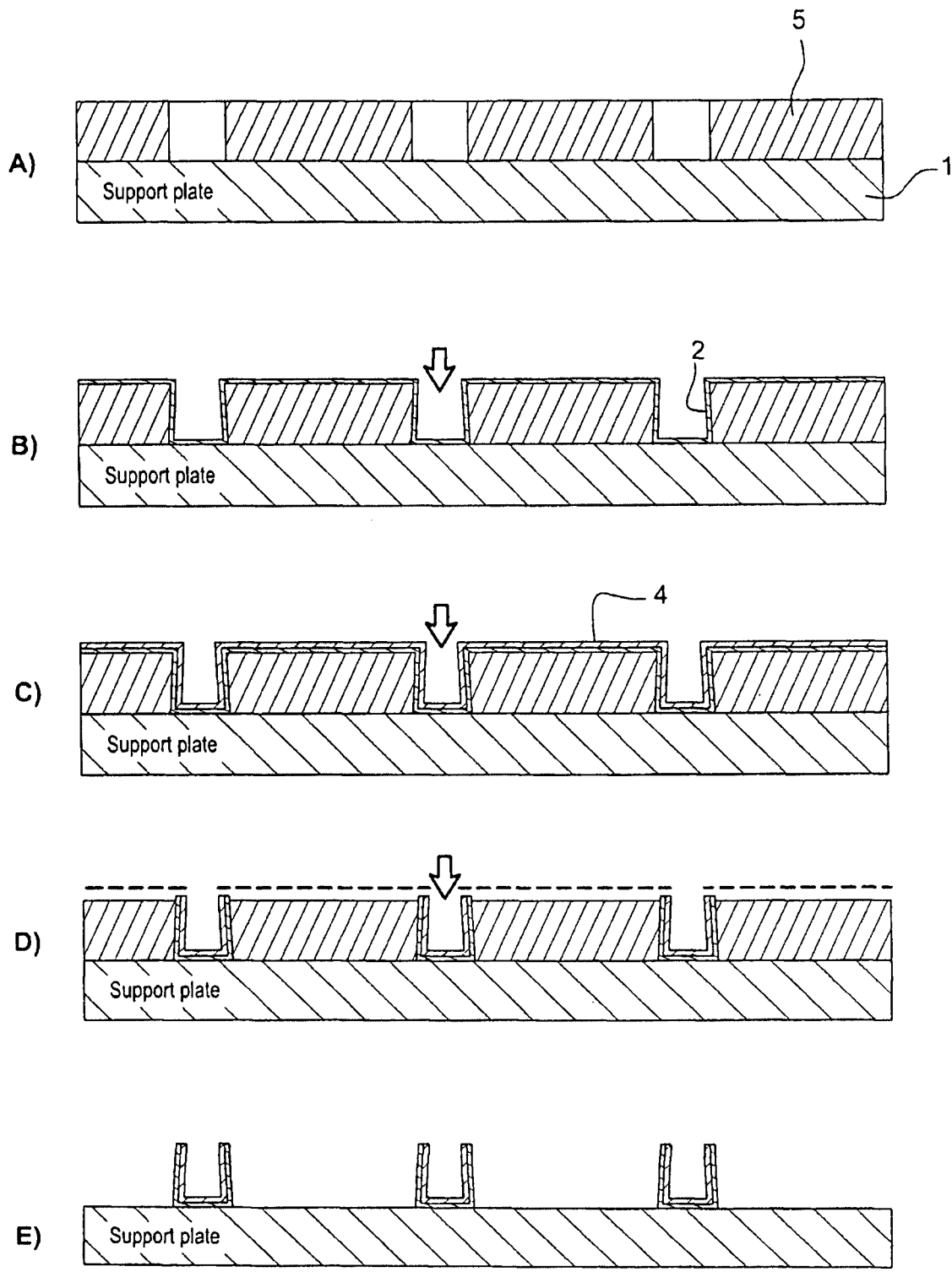
Figure 5:
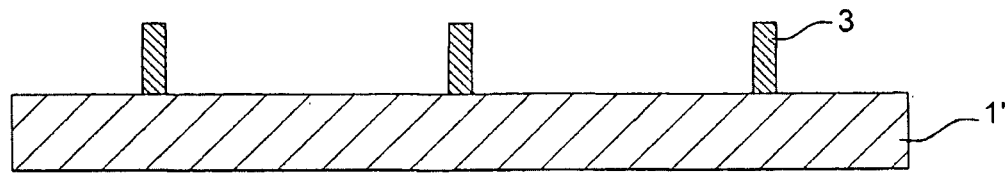
Figure 6:
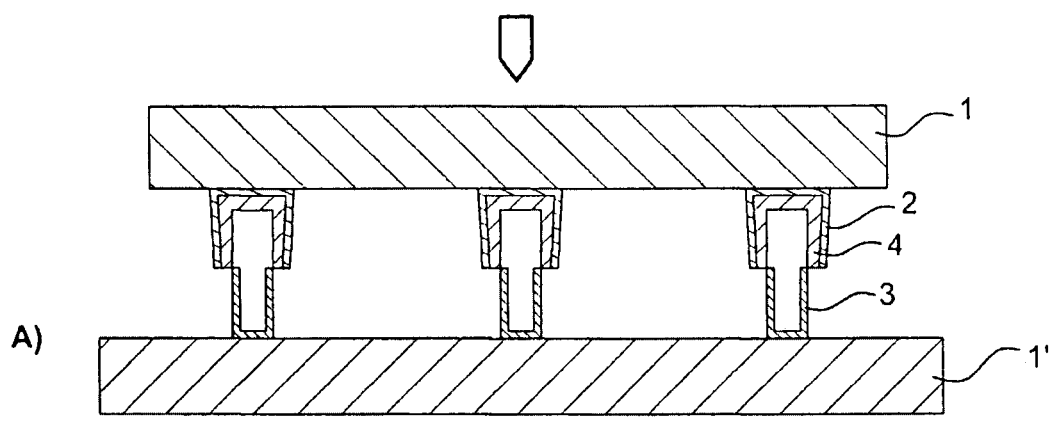
Figure 6:
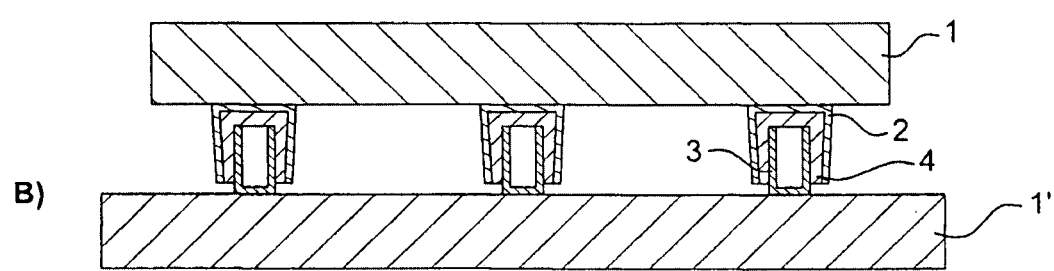
Figure 7:
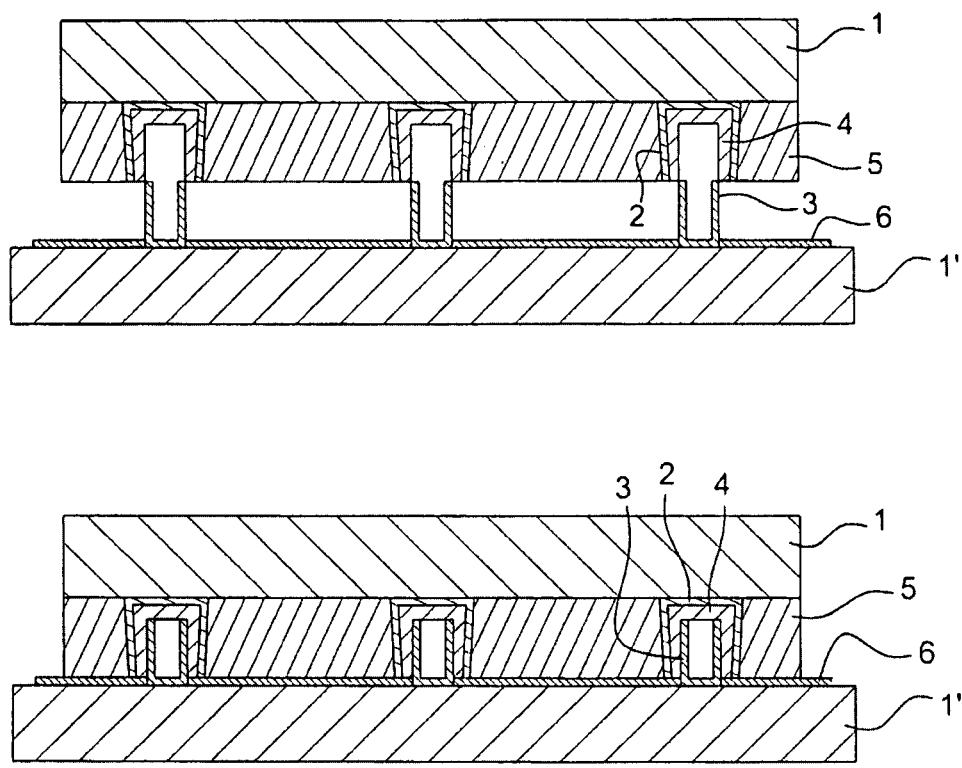
Figure 1:
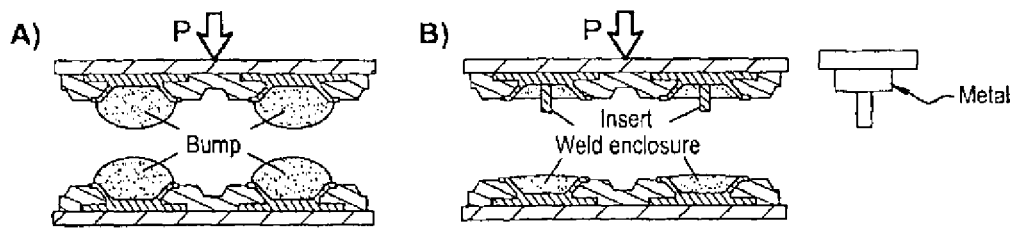
Figure 2:
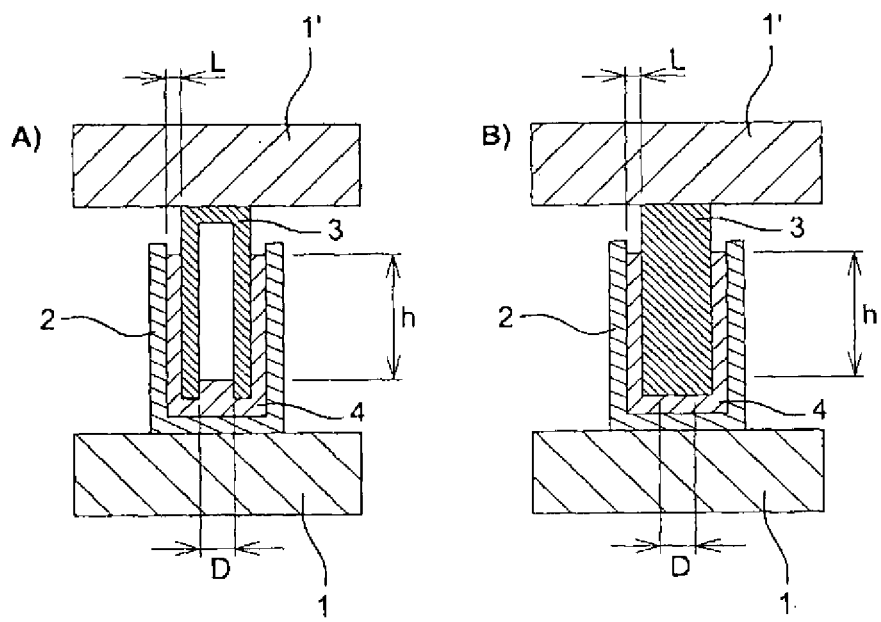
Figure 3:
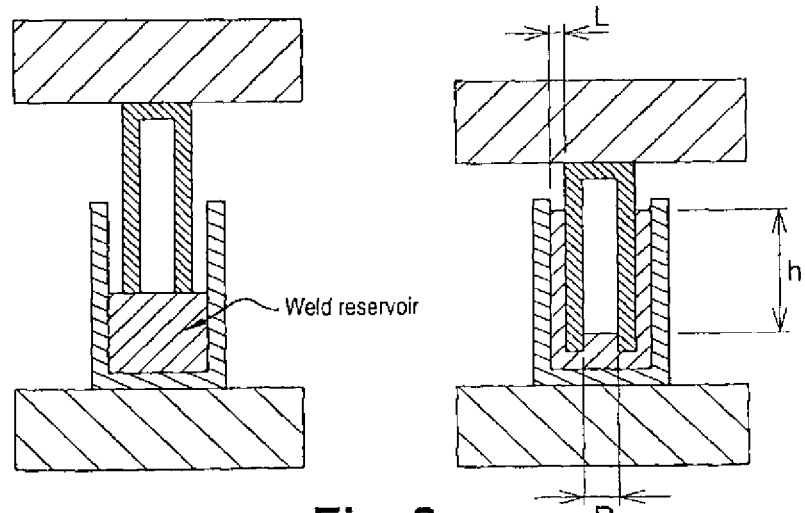
Figure 4:
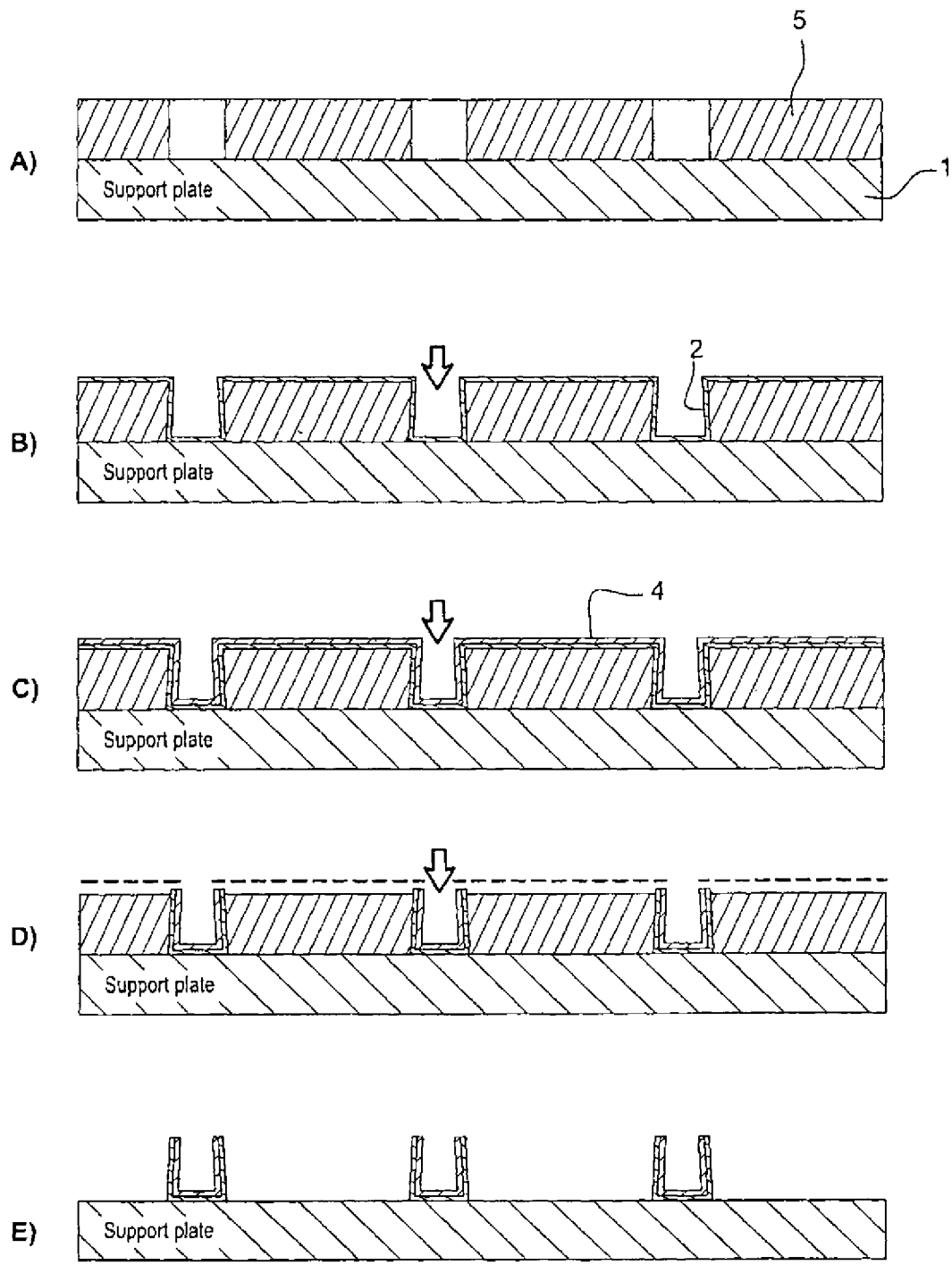
Figure 5:
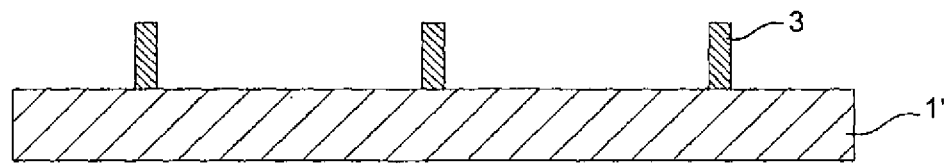
Figure 6:
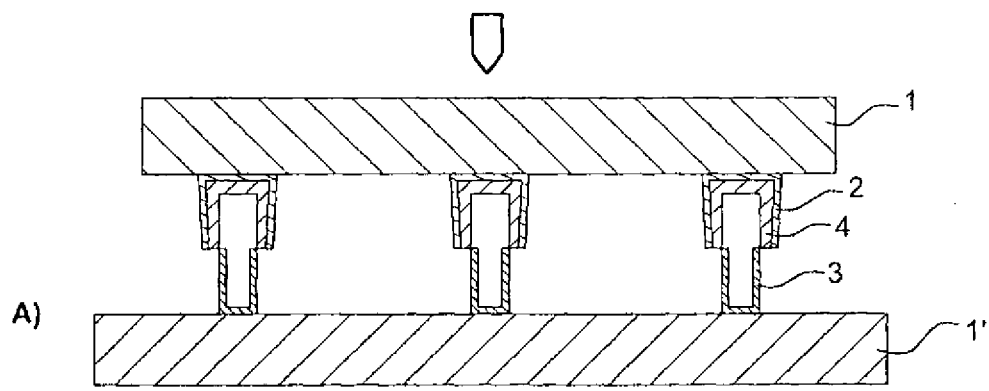
Figure 6:
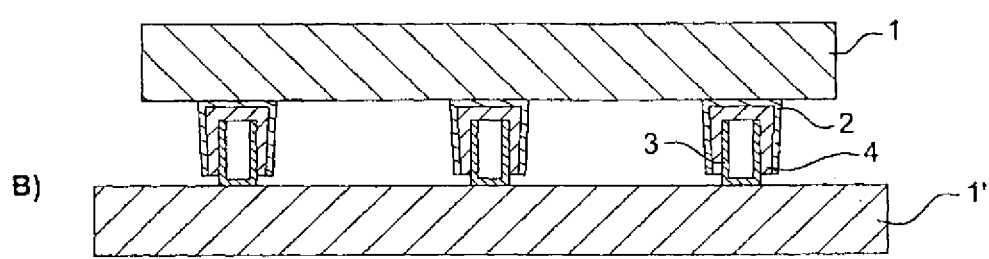
Figure 7:
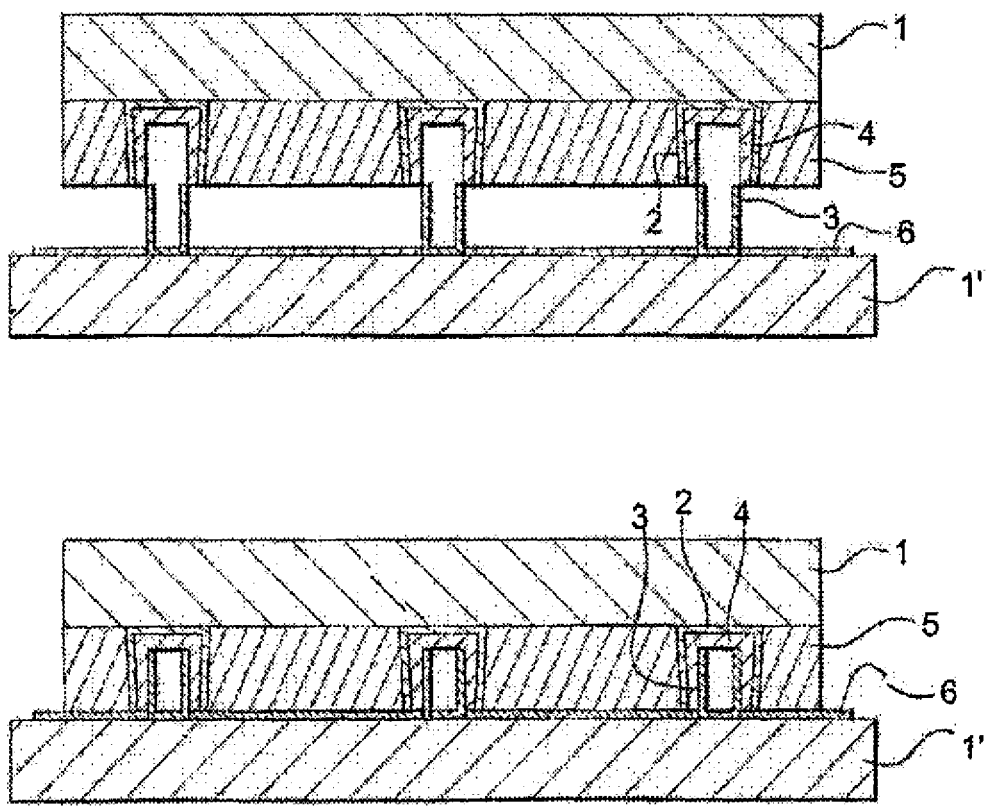

A more elaborate hybridization method is shown in FIG. 7. In this scenario, the so-called "sacrificial" layer (5) present on the component provided with female inserts is made using a permanent material. In other words, the step in FIG. 4E is not implemented and the sacrificial layer is retained at the end of the manufacture of the female inserts filled with solder.

The surface of the component which is found opposite the sacrificial layer may, before or after insertion, be coated with a layer of adhesive (6). The connection between the two components, and therefore the final structure, is thereby consolidated, as shown in diagrammatic form in FIG. 7.

The advantages of the present invention can be seen clearly from the present application:

the components to be joined can be interfaced with zero force, unlike with prior art methods;

the hybridization method comprises only two steps: a step of pre-insertion before soldering, during which the components are able to be moved with no risk of misalignment, and then a step of reflow soldering so that a plurality of pre-inserted elements can be soldered simultaneously;

the contact between the inserts is thus provided by a metallurgical connection of the solder type;

the contact surface between the two inserts is maximized relative to the volume of solder employed. It is conceivable for the solder to be pumped from a "reservoir of solder", located at the bottom of the female tube.

Very high aspect ratio inserts can thus be made with very fine interconnect pitches, using fully mastered technologies from the semi-conductor industry.

The proposed technique makes it possible in particular to multiply the number of hybridized points with constant insertion force. At the same time, pixel access resistance is improved, typically by a factor of 2 for the same photolithographic resolution.

The present invention can be used in a number of ways, and in particular:

for large-scale heterogeneous detection matrices, with a great number of connections by insertion (cooled IRC-MOS CMT, X-ray sensors, etc.);

for "cold" hybridized temperature-sensitive matrices;

for matrices sensitive to mechanical stress;

as a stratum-to-stratum interconnection method for 3D Si-CMOS stacks (0 Force Tamb stack +0 Force collective anneal of the stack formed): the stack is made at ambient temperature, each stratum is laid with no need to exert any force, and a collective anneal of the stack is applied. Each chip is thus subject to only one thermal soldering cycle, which avoids embrittling the interfaces and diffusion barriers;

for MEMS ("Micro Electro Mechanical Systems") connections on CMOS sensitive to thermal stress and force.

The invention claimed is:

1. Connection device between two components, each of the components comprising a hollow conductive insert, the insert into which is fitted another hollow conductive insert, the two inserts being electrically connected by a solder element located in a space between longitudinal walls of the inserts, and wherein a level of the solder element inside the inserts is below that between the walls of the two inserts.

2. Connection device as claimed in claim 1, wherein the hollow conductive insert has an annular cross-section, which is round, oval, or parallelepiped.

3. Connection device as claimed in claim 1, wherein the solder element is an electrically conductive material, in contact with the two inserts.

4. Connection device as claimed in claim 1, wherein the length or the diameter (D) of the insert is much greater than the distance between the walls of the two inserts.

* * * * *

UNITED STATES PATENT AND TRADEMARK OFFICE
CERTIFICATE OF CORRECTION

PATENT NO.        : 8,093,728 B2
APPLICATION NO.   : 12/558149
DATED             : January 10, 2012
INVENTOR(S)       : Francois Marion It is certified that error appears in the above-identified patent and that said Letters Patent is hereby corrected as shown below:

Title page, illustrative fig. 2 should be deleted and substitute therefore the attached title page consisting of illustrative fig. 2.

In the Drawings

The drawing sheets 1-4 consisting of Fig(s) 1-7 should be deleted and substitute therefore the attached drawing sheets 1-4 consisting of Fig(s) 1-7.

Signed and Sealed this
First Day of May, 2012

David J. Kappos
*Director of the United States Patent and Trademark Office*

(12) United States Patent
Marion

(10) Patent No.: US 8,093,728 B2
(45) Date of Patent: Jan. 10, 2012

(54) CONNECTION BY FITTING TOGETHER TWO SOLDERED INSERTS

(75) Inventor: Francois Marion, Saint Martin le Vinoux (FR)

(73) Assignee: Commissariat a l'Énergie Atomique (FR)

( * ) Notice: Subject to any disclaimer, the term of this patent is extended or adjusted under 35 U.S.C. 154(b) by 145 days.

(21) Appl. No.: 12/558,149

(22) Filed: Sep. 11, 2009

(65) Prior Publication Data

US 2010/0072631 A1 Mar. 25, 2010

(30) Foreign Application Priority Data

Sep. 25, 2008 (FR) .................... 08 56465

(51) Int. Cl.
*H01L 23/48* (2006.01)
*H01L 23/52* (2006.01)

(52) U.S. Cl. .......... 257/779; 257/697; 257/E23.026

(58) Field of Classification Search ............ 257/697, 257/779, E23.026
See application file for complete search history.

(56) References Cited

U.S. PATENT DOCUMENTS

| | | | | |
|---|---|---|---|---|
| 4,914,267 A * | 4/1990 | Derbyshire | | 219/85.1 |
| 5,234,865 A * | 8/1993 | Goebel et al. | | 228/123.1 |
| 5,711,680 A * | 1/1998 | Tsuneaki et al. | | 439/83 |
| 6,007,349 A * | 12/1999 | Distefano et al. | | 439/71 |
| 6,179,198 B1 | 1/2001 | Eifuki et al. | | |
| 6,439,924 B1 * | 8/2002 | Kooiman | | 439/578 |
| 6,818,839 B2 * | 11/2004 | Hosaka et al. | | 174/262 |
| 7,557,452 B1 * | 7/2009 | Williams et al. | | 257/778 |
| 2004/0197979 A1 | 10/2004 | Jeong et al. | | |
| 2005/0104222 A1 | 5/2005 | Jeong et al. | | |
| 2005/0151273 A1 | 7/2005 | Arnold et al. | | |
| 2006/0113681 A1 * | 6/2006 | Jeong et al. | | 257/780 |
| 2007/0148817 A1 | 6/2007 | Williams et al. | | |
| 2009/0305523 A1 * | 12/2009 | Di Stefano | | 439/66 |

FOREIGN PATENT DOCUMENTS

JP 01226160 A 9/1989
WO WO2006054005 A1 5/2006

OTHER PUBLICATIONS

French Search Report, dated Dec. 23, 2008 for French Priority Application No. FR0856465 filed on Sep. 25, 2008.
Wong et al., "Characterization of a No-Flow Underfill Encapsulant During the Solder Reflow Process", 1998 Electronic Components and Technology Conference, pp. 1253-1259.
Wassink, "Soldering in Electronics 2nd Edition", Electrochemical Pub Limited, pp. 37-61.
P.C. Andricacos et al., "Damascene Copper Electroplating for Chip Interconnections", IBM Journal of Research and Development, vol. 42, Issue 5, Sep. 1998, pp. 567-574; ISSN 0018-8646.

* cited by examiner

Primary Examiner — Nitin Parekh
(74) Attorney, Agent, or Firm — Victor A. Cardona; Heslin Rothenberg Farley & Mesiti P.C.

(57) ABSTRACT

A connection device between two components includes a hollow conductive insert, into which is fitted another conductive insert, the electrical connection between the two inserts being provided by means of a solder element.

4 Claims, 4 Drawing Sheets

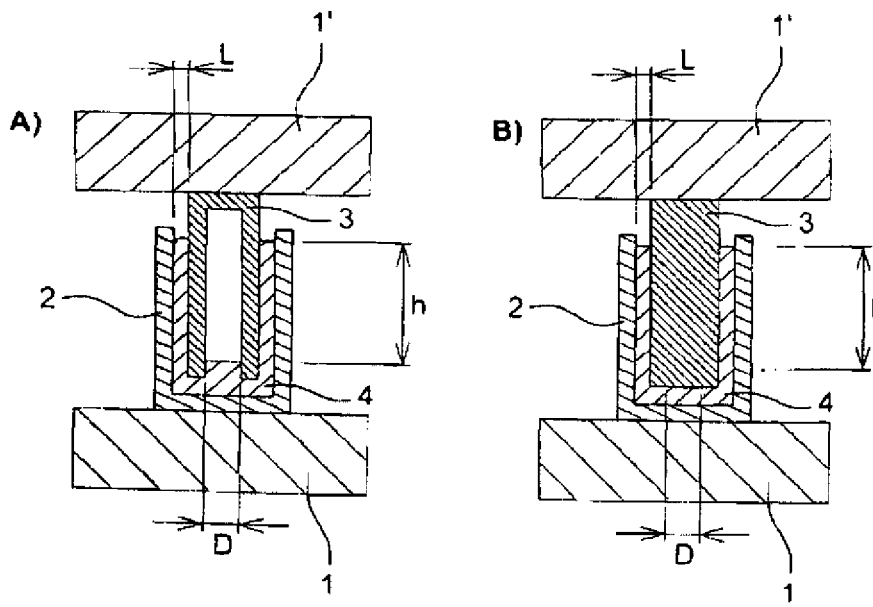

Fig. 2

UNITED STATES PATENT AND TRADEMARK OFFICE
CERTIFICATE OF CORRECTION

| | | |
|---|---|---|
| PATENT NO. | : 8,093,728 B2 | |
| APPLICATION NO. | : 12/558149 | |
| DATED | : January 10, 2012 | |
| INVENTOR(S) | : Francois Marion | |

It is certified that error appears in the above-identified patent and that said Letters Patent is hereby corrected as shown below:

Title page, illustrative fig. 2 should be deleted and substitute therefore the attached title page consisting of illustrative fig. 2.

In the Drawings

The drawing sheets 1-4 consisting of Fig(s) 1-7 should be deleted and substitute therefore the attached drawing sheets 1-4 consisting of Fig(s) 1-7.

This certificate supersedes the Certificate of Correction issued May 1, 2012.

Signed and Sealed this
Twenty-second Day of January, 2013

David J. Kappos
*Director of the United States Patent and Trademark Office*

(12) United States Patent
Marion

(10) Patent No.: US 8,093,728 B2
(45) Date of Patent: Jan. 10, 2012

(54) CONNECTION BY FITTING TOGETHER TWO SOLDERED INSERTS

(75) Inventor: Francois Marion, Saint Martin le Vinoux (FR)

(73) Assignee: Commissariat a l'Energie Atomique (FR)

( * ) Notice: Subject to any disclaimer, the term of this patent is extended or adjusted under 35 U.S.C. 154(b) by 145 days.

(21) Appl. No.: 12/558,149

(22) Filed: Sep. 11, 2009

(65) Prior Publication Data
US 2010/0072631 A1    Mar. 25, 2010

(30) Foreign Application Priority Data
Sep. 25, 2008    (FR) .................... 08 56465

(51) Int. Cl.
*H01L 23/48* (2006.01)
*H01L 23/52* (2006.01)
(52) U.S. Cl. ............ 257/779; 257/697; 257/E23.026
(58) Field of Classification Search .......... 257/697, 257/779, E23.026
See application file for complete search history.

(56) References Cited

U.S. PATENT DOCUMENTS

| | | | | |
|---|---|---|---|---|
| 4,914,267 A | * | 4/1990 | Derbyshire | 219/85.1 |
| 5,234,865 A | * | 8/1993 | Goebel et al. | 228/123.1 |
| 5,711,680 A | * | 1/1998 | Tsuneaki et al. | 439/83 |
| 6,007,349 A | * | 12/1999 | Distefano et al. | 439/71 |
| 6,179,198 B1 | | 1/2001 | Eifuki et al. | |
| 6,439,924 B1 | * | 8/2002 | Kooiman | 439/578 |
| 6,818,839 B2 | * | 11/2004 | Hosaka et al. | 174/262 |
| 7,557,452 B1 | * | 7/2009 | Williams et al. | 257/778 |
| 2004/0197979 A1 | | 10/2004 | Jeong et al. | |
| 2005/0104222 A1 | | 5/2005 | Jeong et al. | |
| 2005/0151273 A1 | | 7/2005 | Arnold et al. | |
| 2006/0113681 A1 | * | 6/2006 | Jeong et al. | 257/780 |
| 2007/0148817 A1 | | 6/2007 | Williams et al. | |
| 2009/0305523 A1 | * | 12/2009 | Di Stefano | 439/66 |

FOREIGN PATENT DOCUMENTS

| | | |
|---|---|---|
| JP | 01226160 A | 9/1989 |
| WO | WO2006054005 A1 | 5/2006 |

OTHER PUBLICATIONS

French Search Report, dated Dec. 23, 2008 for French Priority Application No. FR0856465 filed on Sep. 25, 2008.
Wong et al., "Characterization of a No-Flow Underfill Encapsulant During the Solder Reflow Process", 1998 Electronic Components and Technology Conference, pp. 1253-1259.
Wassink, "Soldering in Electronics 2nd Edition", Electrochemical Pub Limited, pp. 37-61.
P.C. Andricacos et al., "Damascene Copper Electroplating for Chip Interconnections", IBM Journal of Research and Development, vol. 42, Issue 5, Sep. 1998, pp. 567-574; ISSN:0018-8646.

* cited by examiner

*Primary Examiner* — Nitin Parekh
(74) *Attorney, Agent, or Firm* — Victor A. Cardona; Heslin Rothenberg Farley & Mesiti P.C.

(57) ABSTRACT

A connection device between two components includes a hollow conductive insert, into which is fitted another conductive insert, the electrical connection between the two inserts being provided by means of a solder element.

4 Claims, 4 Drawing Sheets

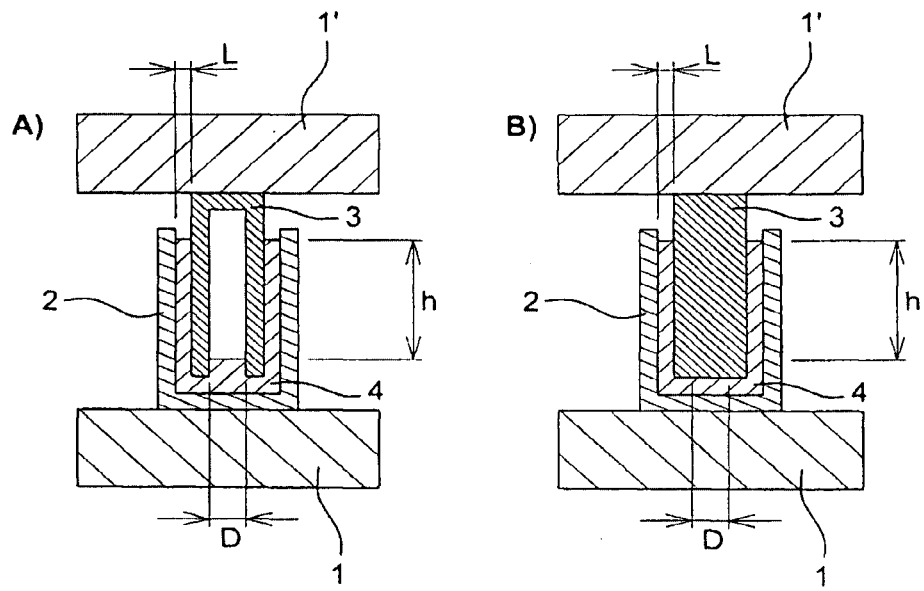

UNITED STATES PATENT AND TRADEMARK OFFICE
CERTIFICATE OF CORRECTION

PATENT NO. : 8,093,728 B2  
APPLICATION NO. : 12/558149  
DATED : January 10, 2012  
INVENTOR(S) : Francois Marion Page 1 of 9

It is certified that error appears in the above-identified patent and that said Letters Patent is hereby corrected as shown below:

Please delete patent 8,093,728 B2 in its entirety and insert patent 8,093,728 B2 in its entirety.

This certificate supersedes the Certificates of Correction issued May 1, 2012 and January 22, 2013.

Signed and Sealed this  
Seventeenth Day of December, 2013

Margaret A. Focarino  
*Commissioner for Patents of the United States Patent and Trademark Office*

(12) United States Patent
Marion

(10) Patent No.: US 8,093,728 B2
(45) Date of Patent: Jan. 10, 2012

(54) CONNECTION BY FITTING TOGETHER TWO SOLDERED INSERTS

(75) Inventor: Francois Marion, Saint Martin le Vinoux (FR)

(73) Assignee: Commissariat a l'Energie Atomique (FR)

(*) Notice: Subject to any disclaimer, the term of this patent is extended or adjusted under 35 U.S.C. 154(b) by 145 days.

(21) Appl. No.: 12/558,149

(22) Filed: Sep. 11, 2009

(65) Prior Publication Data

US 2010/0072631 A1 Mar. 25, 2010

(30) Foreign Application Priority Data

Sep. 25, 2008 (FR) .................................. 08 56465

(51) Int. Cl.
*H01L 23/48* (2006.01)
*H01L 23/52* (2006.01)

(52) U.S. Cl. ............... 257/779; 257/697; 257/E23.026
(58) Field of Classification Search .............. 257/697, 257/779, E23.026
See application file for complete search history.

(56) References Cited

U.S. PATENT DOCUMENTS

| | | | |
|---|---|---|---|
| 4,914,267 A * | 4/1990 | Derbyshire | 219/85.1 |
| 5,234,865 A * | 8/1993 | Goebel et al. | 228/123.1 |
| 5,711,680 A * | 1/1998 | Tsuneaki et al. | 439/83 |
| 6,007,349 A * | 12/1999 | Distefano et al. | 439/71 |
| 6,179,198 B1 | 1/2001 | Eifuki et al. | |
| 6,439,924 B1 * | 8/2002 | Kooiman | 439/578 |
| 6,818,839 B2 * | 11/2004 | Hosaka et al. | 174/262 |
| 7,557,452 B1 * | 7/2009 | Williams et al. | 257/778 |
| 2004/0197979 A1 | 10/2004 | Jeong et al. | |
| 2005/0104222 A1 | 5/2005 | Jeong et al. | |
| 2005/0151273 A1 | 7/2005 | Arnold et al. | |
| 2006/0113681 A1 * | 6/2006 | Jeong et al. | 257/780 |
| 2007/0148817 A1 | 6/2007 | Williams et al. | |
| 2009/0305523 A1 * | 12/2009 | Di Stefano | 439/66 |

FOREIGN PATENT DOCUMENTS

| JP | 01226160 A | 9/1989 |
|---|---|---|
| WO | WO2006054005 A1 | 5/2006 |

OTHER PUBLICATIONS

French Search Report, dated Dec. 23, 2008 for French Priority Application No. FR0856465 filed on Sep. 25, 2008.
Wong et al., "Characterization of a No-Flow Underfill Encapsulant During the Solder Reflow Process", 1998 Electronic Components and Technology Conference, pp. 1253-1259.
Wassink, "Soldering in Electronics 2nd Edition", Electrochemical Pub Limited, pp. 37-61.
P.C. Andricacos et al., "Damascene Copper Electroplating for Chip Interconnections", IBM Journal of Research and Development, vol. 42, Issue 5, Sep. 1998, pp. 567-574; ISSN:0018-8646.

* cited by examiner

*Primary Examiner* — Nitin Parekh
(74) *Attorney, Agent, or Firm* — Victor A. Cardona; Heslin Rothenberg Farley & Mesiti P.C.

(57) ABSTRACT

A connection device between two components includes a hollow conductive insert, into which is fitted another conductive insert, the electrical connection between the two inserts being provided by means of a solder element.

4 Claims, 4 Drawing Sheets

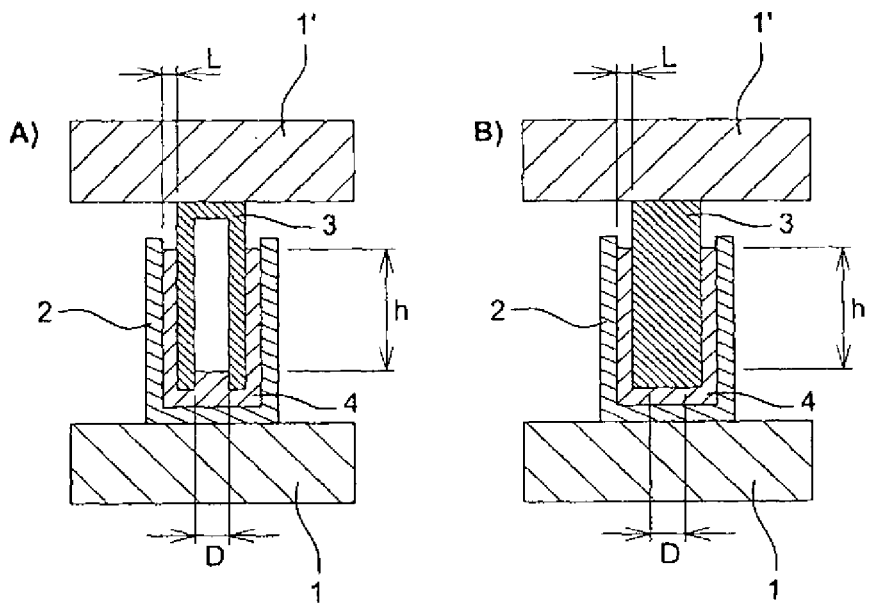

8,093,728 B2

CONNECTION BY FITTING TOGETHER TWO SOLDERED INSERTS

CROSS REFERENCE TO RELATED APPLICATIONS

This application claims priority from French patent application No. 0856465, filed on Sep. 25, 2008, the entire disclosure of which is incorporated herein by reference.

FIELD OF THE INVENTION

The technical field to which the invention relates is that of microelectronics, and to be more specific that of the manufacture and vertical (better known as "flip-chip") connection of two components.

The present invention can be used in all sorts of devices requiring "flip-chip" interconnects, particularly with a very fine pitch, as is the case for the manufacture of very large scale very fine-pitch imaging devices.

It is proposed to establish the connection by fitting an insert into a hollow insert, and then making a solder between the two inserts.

PRIOR ART

There are currently basically two possibilities for joining together two components that require a large number of very fine-pitch vertical electrical connections using the "flip-chip" technique by thermocompression:

- the first thermocompression technique comprises pressing two beads, at temperature, one against the other so as to bind them by plastic deformation (FIG. 1A);
- the second technique, developed for the finest interconnect pitches, allows working at a lower temperature than the temperatures used in the first technique: it involves replacing one of the thermocompressed beads by a "hard" protuberance which penetrates into the solder bead opposite and breaks its native oxide surface to obtain an electrical contact, said method operating at low temperature. This second technique thus makes it possible to:
  reduce the assembly temperature and assembly pressure;
  control the crushing: there is no hard to control bead-on-bead plastic deformation.

This second technique, shown in FIG. 1B, is shown in the document WO2006/054005 and appropriate inserts are described in the document U.S. Pat. No. 6,179,198.

The present invention falls within this second technique, known as insertion thermocompression, and aims to resolve the limitations in relation thereto, which are basically two in number.

The first problem relates to the thermocompression forces. Indeed, the cross-section of the insert in the plane (X, Y) is required to be as low as possible so as to restrict the insertion force.

If the number of columns to be inserted increases, the insertion force to be exerted on the part for assembly is proportionate to the number N of connections to be implemented, and to the surface of their cross-section S, in accordance with the following formula:

$$F_{nvb} = k \cdot S \cdot N$$

This technique is thereby limited in respect of components with a very large number of connections, since it is known for example that a force of 4 tonnes would be needed to hybridize a matrix of 4 million pixels (1 g/bump).

The problem in relation to these forces may be exacerbated owing to the sensitivity of the assembled components. Some materials for assembly are thus very sensitive to local stresses, leading to the creation of destructive dislocations during thermocompression hybridization.

Alternatively, the forces brought into play are no longer compatible with the required precision of assembly. Indeed, the requisite maximum lateral movement after hybridization must be less than 1 micrometre.

The second major technical problem raised by the insertion thermocompression technique is related to the way the inserts are made.

Indeed, making protuberances in a semiconductor foundry may become problematic in respect of very fine pitches. If the cross-section of the inserts is reduced, conventional production techniques may prove hard to implement, given the fineness of the required inserts. This restriction is therefore related to the concept of a minimum fineness of photolithography. It is thus not possible to reduce the cross-section of a conventional full insert, for a given technological photolithographic resolution D, below the value $\pi \cdot D^2 / 4$.

DISCLOSURE OF THE INVENTION

Having analysed all these specific constraints, a particular technical solution is proposed based on the following elements:

- a solder element providing a perfect tube-to-tube or tube-to-cylinder joint;
- the use of the special capillarity properties of solders.

Thus and in accordance with a first aspect, the present invention relates to a connection device between two components consisting of a hollow conductive insert, into which is fitted another conductive insert, the electrical connection between the two inserts being provided by means of a solder element.

The first conductive insert is therefore found on the surface of the first component for connection. This is a hollow, female, element, capable of receiving another conductive insert, itself located on the surface of the second component for connection.

This first conductive element, comparable to a tube, may either be of annular cross-section (in particular round or oval) or parallelepiped (particularly square or rectangular).

The second conductive insert (male part) is therefore of strictly smaller dimensions than the first (female part), so that it can be appropriately fitted therein. It may be full (comparable to a column or full cylinder) or hollow (comparable to a tube). To advantage, it is a hollow insert.

These two inserts are to advantage metal-based so that they can function as an electrical conductor. This may for example involve Cu, W, Pd, Ti, WSi, WN.

It is noteworthy in accordance with the invention that the connection device further comprises an electrically conductive solder material, in contact simultaneously with the two inserts and thereby connecting them both mechanically and electrically. This element in particular gives a perfect electrical joint between the two soldered inserts.

To make said joint, the internal and external surfaces of the facing inserts, respectively, are filled with a solder material.

In practice, the solder material may be deposited on the internal walls of the hollow insert at the time it is manufactured. Alternatively, the hollow insert is provided with a reservoir of solder at its bottom.

Given the capillarity properties of molten solders and where the fitted insert is hollow, the level of the solder between the two inserts may to advantage be higher than the level of the solder in this hollow insert.

Indeed and as is well known to the man skilled in the art (K. Wassink, Soldering in electronics, $2^{nd}$ ed Electrochemical Pub Limited, pp 37-61, Wetting of surfaces), a liquid placed in a tube of diameter D will rise by a height K/D in the column. Under the same principle, a solder placed between two parallel walls, separated by a distance L, will rise by a height K'/L between the walls. K and K' are a function of the surface properties at work (roughness, surface properties, possibility of creating intermetallics when soldering: same reference pp. 149-170).

By playing on all these properties (surface tension, surface wettability), and more particularly by designing a device wherein L<<D, things can easily be arranged so that the volume of solder provided in the bottom of the female tube rises essentially between the reduced space between the two tubes. In this way, said space is filled up, in the manner for example of conventional copper-to-copper solders used macroscopically in plumbing (oxyacetylene soldering of pre-inserted pipes with solder input).

In practice and as already stated, the distance L separating the lateral walls of the two inserts is to advantage not zero, to ensure that fitting is accurate on the one hand and to allow the solder material to rise between the two inserts on the other.

Furthermore and to advantage when hollow inserts are present, the length or diameter D of the fitted insert is much greater than the distance L separating the walls of the two inserts. This implies, as an additional advantageous condition, that the inserts have parallel walls. The solder element thus rises essentially in the space provided between the walls of the two inserts.

Another aspect of the invention relates to the connection method strictly speaking between the two components.

Said method has one significant advantage: the two inserts for connection can be interfaced with zero force.

In practice, said method can be broken down into two steps:

A standard "pick and place" positioning machine pre-inserts the components, before soldering. The parts inserted may then be moved with no risk of misalignment, prior to reflow soldering.

The soldering step, and strictly speaking the reflow soldering step, is then implemented. It may be implemented using a reflow oven.

At the end of this method, a connection element between components is obtained in accordance with the one described above.

In a particular embodiment, a layer of adhesive is deposited before fitting on the surface of at least one of the components, between the inserts. In the event of the sacrificial layer of the component provided with female inserts being retained, connection stability can also be improved.

BRIEF DESCRIPTION OF THE FIGURES

Figure 1:
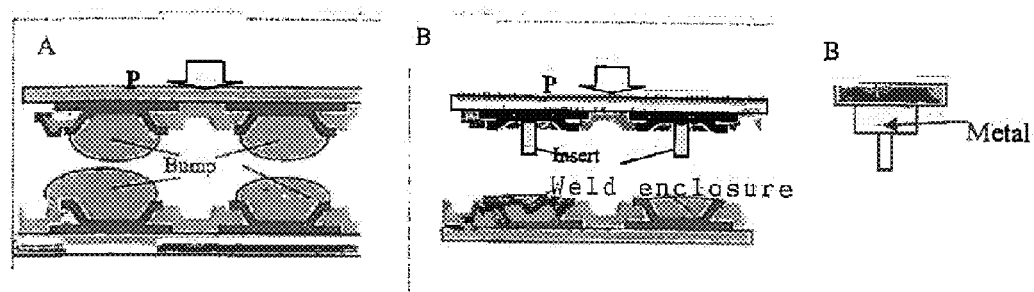
FIG. 1 shows the different substrate-to-chip connection systems according to the prior art.

The way in which the invention can be implemented and the resulting advantages will become clearer from the following embodiment, given for information purposes and not restrictively, supported by the appended figures wherein:

FIG. 1 shows the different substrate-to-chip connection systems according to the prior art.

FIG. 2 is a diagram of an inventive connection device comprising a hollow insert into which is fitted a second insert, itself hollow (A) or full (B), the two inserts being in contact via a solder element.

FIG. 3 is a diagram of the hybridization of two components via the insertion of a tube into another tube containing a solder material.

FIG. 4 is a diagram of the different steps in the manufacture of a component provided with "female" inserts according to the invention.

Figure 5:
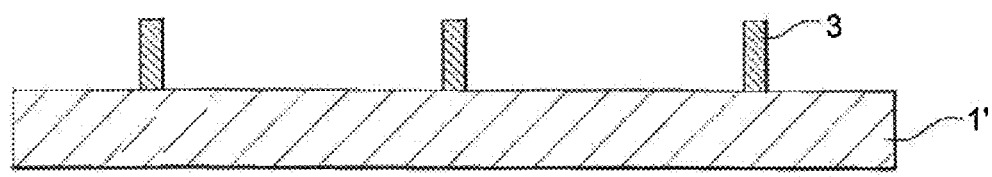
FIG. 5 shows a cross-section view of a component provided on its surface with full cylinder-shaped protuberances.

FIG. 5 shows a cross-section view of a component provided on its surface with full cylinder-shaped protuberances.

FIG. 6 shows in detail the inventive method for hybridizing between two components.

FIG. 7 shows in detail an alternative inventive hybridization method, involving the retention of a "sacrificial" layer and strengthening by bonding.

EMBODIMENTS OF THE INVENTION

To obtain a connection element as per the object of the invention, and to implement the method for hybridizing between two components in accordance with the invention, protuberances (also known as inserts) intended for the connection need to be manufactured. These are located on the surface of the components which need to be connected electrically.

A component provided with inserts, in accordance with the present invention, may be obtained using the method shown in FIG. 4. This typically involves a CMOS ("metal-oxide semiconductor") wafer produced by a silicon foundry, a ceramic casing or the like.

FIG. 4 shows in more detail the manufacture of inserts or protuberances in the form of a female tube, with the internal walls thereof being metal-based and coated with a solder material.

The first step (FIG. 4A) comprises depositing, on the component for connection (1), a so-called "sacrificial" layer, of thickness e1 made using a resin (5). This layer is then subjected to standard photolithography. This step is used to create apertures of the required diameter for the tubes which will act as inserts (2). More generally, it is at this step that the future shape of the insert is set (height, aperture shape, etc.).

The second step (FIG. 4B) corresponds to the deposition of metal, possibly a metal multi-layer, matching the tube. It is the thickness of this deposition which will dictate the thickness e of the hollow insert. The metal is for example selected from the group that comprises: Cu, W, Pd, Ti, WSi, WN.

The aperture diameters can be controlled at values below 1 micrometre and heights above 3 micrometres.

The thicknesses of the metals can be adjusted and controlled down to values below 0.1 micrometre.

It is possible to modify, or simply to complete the usual metal deposition with an additional layer of a wettable metal, to advantage gold, platinum or copper. The advantage of this is that it facilitates subsequent soldering and the creation of the requisite intermetallic interfaces during the final soldering.

In a preferred embodiment, the hollow insert assumes a final "tube" shape, corresponding to a circular aperture. However, any other shape may be employed by an adapted design of the aperture mask: triangle, square, polygon, etc.

It is also possible to combine different shapes on a single manufactured plate and/or on a single chip to be hybridized.

The third step (FIG. 4C) comprises depositing a solder material (4) inside the tube, on its internal walls. This solder material is selected from conventionally used materials, that afford reliability of assembly: they do not cause the formation of "voids" and are resistant to electromigration, have good durability, do not present any premature ageing and are resistant to thermal cycling. This typically means (In), $In_xSn_y$, $Au_xSn_y$, or $Cu_xAg_ySn_z$. In practice, the solder material is deposited following the metal deposition implemented at the previous step (FIG. 4B).

The fourth step (FIG. 4D) comprises removing the metal layer, and the solder layer, found on the upper plane of the martyr resin. Two etching techniques, well known to the man skilled in the art, may be implemented: the "damascene etching" technique or "gap fill" method.

The last step (FIG. 4E), which is an optional step, corresponds to the removal of the martyr layer (5). This is a fully understood step known as de-lacquering.

A hollow female insert of this kind is for example shown in FIG. 2.

It is clear to the man skilled in the art that the male insert, intended to be fitted into the female insert described above, may be obtained using a similar method, give or take a few modifications:
- the male insert has a cross-section of smaller dimension than that of the hollow female insert into which it is intended to be inserted or fitted;
- the male insert is devoid of solder material, at least on its internal walls;
- the male insert may assume the shape of a cylinder or a full parallelepiped. To achieve this, at the metal deposition step (FIG. 4B), the cavities generated in the martyr layer by photolithography (FIG. 4A) must be entirely filled with metal, leaving no voids. Furthermore, the man skilled in the art may easily produce cylinders, using electrolytic growth techniques widely described in the literature (see for example P. C. Andricacos et al., IBM Journal of Research and Development, 1998, 42(5), pp 567-74, *Damascene copper electroplating for chip interconnections*). Such a cylindrical shape for the male insert is shown in diagrammatic form in FIG. 5.

The components provided with such inserts may then be connected during the hybridization method set out in detail hereinafter.

A first method is shown in diagrammatic form in FIG. 3 in relation to two hollow inserts, the female insert having a reservoir of solder.

FIG. 6 shows in greater detail an inventive hybridization method:

In a first step (FIG. 6A), the female inserts, whereof the internal walls are coated with the solder material, are placed opposite the male inserts. The weight of the upper chip is then sufficient to fit together the facing inserts. If need be, a slight pressure is exerted to complete the fitting.

After insertion with almost zero force, two components are obtained that are electrically connected by means of an inventive connection device (FIG. 6B).

A more elaborate hybridization method is shown in FIG. 7. In this scenario, the so-called "sacrificial" layer (5) present on the component provided with female inserts is made using a permanent material. In other words, the step in FIG. 4E is not implemented and the sacrificial layer is retained at the end of the manufacture of the female inserts filled with solder.

The surface of the component which is found opposite the sacrificial layer may, before or after insertion, be coated with a layer of adhesive (6). The connection between the two components, and therefore the final structure, is thereby consolidated, as shown in diagrammatic form in FIG. 7.

The advantages of the present invention can be seen clearly from the present application:
- the components to be joined can be interfaced with zero force, unlike with prior art methods;
- the hybridization method comprises only two steps: a step of pre-insertion before soldering, during which the components are able to be moved with no risk of misalignment, and then a step of reflow soldering so that a plurality of pre-inserted elements can be soldered simultaneously;
- the contact between the inserts is thus provided by a metallurgical connection of the solder type;
- the contact surface between the two inserts is maximized relative to the volume of solder employed. It is conceivable for the solder to be pumped from a "reservoir of solder", located at the bottom of the female tube.

Very high aspect ratio inserts can thus be made with very fine interconnect pitches, using fully mastered technologies from the semi-conductor industry.

The proposed technique makes it possible in particular to multiply the number of hybridized points with constant insertion force. At the same time, pixel access resistance is improved, typically by a factor of 2 for the same photolithographic resolution.

The present invention can be used in a number of ways, and in particular:
- for large-scale heterogeneous detection matrices, with a great number of connections by insertion (cooled IRC-MOS CMT, X-ray sensors, etc.);
- for "cold" hybridized temperature-sensitive matrices;
- for matrices sensitive to mechanical stress;
- as a stratum-to-stratum interconnection method for 3D Si-CMOS stacks (0 Force Tamb stack +0 Force collective anneal of the stack formed): the stack is made at ambient temperature, each stratum is laid with no need to exert any force, and a collective anneal of the stack is applied. Each chip is thus subject to only one thermal soldering cycle, which avoids embrittling the interfaces and diffusion barriers;
- for MEMS ("Micro Electro Mechanical Systems") connections on CMOS sensitive to thermal stress and force.

The invention claimed is:

1. Connection device between two components, each of the components comprising a hollow conductive insert, the insert into which is fitted another hollow conductive insert, the two inserts being electrically connected by a solder element located in a space between longitudinal walls of the inserts, and wherein a level of the solder element inside the inserts is below that between the walls of the two inserts.

2. Connection device as claimed in claim 1, wherein the hollow conductive insert has an annular cross-section, which is round, oval, or parallelepiped.

3. Connection device as claimed in claim 1, wherein the solder element is an electrically conductive material, in contact with the two inserts.

4. Connection device as claimed in claim 1, wherein the length or the diameter (D) of the insert is much greater than the distance between the walls of the two inserts.

* * * * *